United States Patent
Paek et al.

(10) Patent No.: US 9,478,517 B2
(45) Date of Patent: Oct. 25, 2016

(54) ELECTRONIC DEVICE PACKAGE STRUCTURE AND METHOD OF FABRICATING THE SAME

(71) Applicant: Amkor Technology, Inc., Chandler, AZ (US)

(72) Inventors: Jong Sik Paek, Incheon (KR); Doo Hyun Park, Gyeonggi-do (KR); Yoon Joo Kim, Seoul (KR); Seong Min Seo, Seoul (KR); Young Suk Chung, Seoul (KR)

(73) Assignee: Amkor Technology, Inc., Tempe, AZ (US)

( * ) Notice: Subject to any disclaimer, the term of this patent is extended or adjusted under 35 U.S.C. 154(b) by 64 days.

(21) Appl. No.: 14/097,214

(22) Filed: Dec. 4, 2013

(65) Prior Publication Data

US 2015/0049421 A1 Feb. 19, 2015

(30) Foreign Application Priority Data

Aug. 13, 2013 (KR) .......................... 10-2013-0096196

(51) Int. Cl.
| | | |
|---|---|---|
| *H01L 23/04* | (2006.01) | |
| *H01L 23/043* | (2006.01) | |
| *H01L 23/00* | (2006.01) | |
| *H01L 23/16* | (2006.01) | |
| *H01L 23/495* | (2006.01) | |
| *H01L 23/31* | (2006.01) | |
| *H01L 21/56* | (2006.01) | |

(52) U.S. Cl.
CPC .............. *H01L 24/82* (2013.01); *H01L 23/16* (2013.01); *H01L 23/4951* (2013.01); *H01L 23/49517* (2013.01); *H01L 23/49548* (2013.01); *H01L 23/49582* (2013.01); *H01L 21/561* (2013.01); *H01L 23/3107* (2013.01); *Y10T 29/49117* (2015.01)

(58) Field of Classification Search
CPC ............ H01L 2224/83193; H01L 2224/8392; H01L 2224/83; H01L 2224/83007; H01L 2224/73265
See application file for complete search history.

(56) References Cited

U.S. PATENT DOCUMENTS

| | | | | |
|---|---|---|---|---|
| 4,855,869 A | * | 8/1989 | Tsuji | ..................... H01L 23/053 174/537 |
| 5,532,906 A | * | 7/1996 | Hanari | ................ H01L 23/5383 257/690 |
| 6,189,762 B1 | * | 2/2001 | Ball | .............................. 228/4.5 |
| 6,208,519 B1 | * | 3/2001 | Jiang | ...................... H01L 23/13 257/706 |

(Continued)

FOREIGN PATENT DOCUMENTS

| | | |
|---|---|---|
| KR | 10-1999-0000204 | 1/1999 |
| KR | 10-0279252 | 1/2001 |

(Continued)

OTHER PUBLICATIONS

Office Action received from Korean Patent Office in Korean; English Translation Not Available; Date: Oct. 31, 2014; 5 pages.

*Primary Examiner* — William F Kraig
*Assistant Examiner* — Maliheh Malek
(74) *Attorney, Agent, or Firm* — Kevin B. Jackson

(57) ABSTRACT

In one embodiment, an electronic device package structure includes an electronic die having conductive pads on one surface. The one surface is further attached to at least one lead. A conductive layer covers at least one conductive pad and at least portion of the lead thereby electrically connecting the lead to the conductive pad.

20 Claims, 12 Drawing Sheets

(56) References Cited

U.S. PATENT DOCUMENTS

| | | | | |
|---|---|---|---|---|
| 6,261,865 | B1* | 7/2001 | Akram | H01L 23/4951 257/E21.705 |
| 6,384,472 | B1* | 5/2002 | Huang | H01L 21/50 257/676 |
| 6,410,979 | B2* | 6/2002 | Abe | 257/666 |
| 6,525,405 | B1* | 2/2003 | Chun et al. | 257/666 |
| 7,208,821 | B2* | 4/2007 | Ha | H01L 23/3107 257/666 |
| 7,217,991 | B1* | 5/2007 | Davis | H01L 23/3107 257/666 |
| 7,242,068 | B2* | 7/2007 | Huang | H01L 27/14618 257/433 |
| 8,652,882 | B2* | 2/2014 | Pan | H01L 21/568 438/111 |
| 9,153,543 | B1* | 10/2015 | Mangrum | H01L 23/60 |
| 9,362,209 | B1* | 6/2016 | Mangrum | H01L 23/043 |
| 2001/0007780 | A1* | 7/2001 | Minamio | H01L 21/565 438/106 |
| 2002/0020907 | A1* | 2/2002 | Seo | H01L 23/4951 257/687 |
| 2002/0084534 | A1* | 7/2002 | Paek | H01L 23/3107 257/778 |
| 2002/0140065 | A1* | 10/2002 | Paek | H01L 23/3114 257/673 |
| 2003/0001252 | A1* | 1/2003 | Ku | H01L 23/3107 257/686 |
| 2004/0207056 | A1* | 10/2004 | Seki | H01L 23/49586 257/676 |
| 2006/0017177 | A1* | 1/2006 | Seng | H01L 23/13 257/784 |
| 2007/0262432 | A1* | 11/2007 | Otremba | H01L 23/3142 257/678 |
| 2007/0296069 | A1* | 12/2007 | Terui | H01L 23/3128 257/676 |
| 2009/0091013 | A1* | 4/2009 | Fukuda et al. | 257/676 |
| 2009/0115042 | A1* | 5/2009 | Koyanagi | 257/686 |
| 2009/0127682 | A1* | 5/2009 | Kim | H01L 21/4832 257/676 |
| 2010/0059875 | A1* | 3/2010 | Sato | H01L 23/4952 257/690 |
| 2010/0258920 | A1* | 10/2010 | Chien | H01L 21/4832 257/666 |
| 2011/0057296 | A1* | 3/2011 | Feng et al. | 257/618 |
| 2011/0140254 | A1* | 6/2011 | Tsai et al. | 257/676 |
| 2012/0001306 | A1* | 1/2012 | Wang et al. | 257/666 |
| 2012/0319256 | A1* | 12/2012 | Lo et al. | 257/666 |
| 2013/0168866 | A1* | 7/2013 | Prajuckamol et al. | 257/773 |
| 2013/0221509 | A1* | 8/2013 | Oda et al. | 257/676 |
| 2014/0001619 | A1* | 1/2014 | Yoo | H01L 24/96 257/676 |
| 2014/0027927 | A1* | 1/2014 | Reinmuth et al. | 257/774 |
| 2014/0036466 | A1* | 2/2014 | Pahl et al. | 361/769 |
| 2014/0063768 | A1* | 3/2014 | Tanaka | H01L 23/3121 361/784 |
| 2014/0103510 | A1* | 4/2014 | Andou | H01L 23/49551 257/676 |
| 2014/0138788 | A1* | 5/2014 | Kim et al. | 257/433 |
| 2014/0306330 | A1* | 10/2014 | Williams | 257/675 |
| 2015/0021751 | A1* | 1/2015 | Paek et al. | 257/676 |
| 2015/0076538 | A1* | 3/2015 | Lei et al. | 257/96 |
| 2015/0270454 | A1* | 9/2015 | Lee | H01L 33/005 257/98 |
| 2016/0043020 | A1* | 2/2016 | Xia | H01L 23/3107 257/676 |

FOREIGN PATENT DOCUMENTS

| | | |
|---|---|---|
| KR | 10-220-0101038 | 12/2004 |
| KR | 10-2012-0131986 | 12/2012 |

* cited by examiner

ELECTRONIC DEVICE PACKAGE STRUCTURE AND METHOD OF FABRICATING THE SAME

CROSS REFERENCE TO RELATED APPLICATIONS

This application claims priority to Korean Patent Application No. 10-2013-0096196 filed on Aug. 13, 2013, which is expressly incorporated by reference herein.

BACKGROUND

The present invention relates to electronic devices and, more specifically, to electronic device package structures and methods of fabricating the same.

Electronic devices, such as semiconductor dies, are conventionally enclosed in plastic packages that protect the semiconductor die from hostile environments and that enable electrical interconnection between the semiconductor die and a next level of assembly, such as a printed circuit board (PCB) or motherboard. The elements of a typical electronic package include a conductive leadframe and an integrated circuit or semiconductor die. In order to electrically connect the semiconductor die to leads of the leadframe, conductive structures are necessary to connect bond pads on the semiconductor die to the leads. A hard plastic encapsulant material typically covers the other components and forms an exterior package body. In the past, the bond pads on the semiconductor die and the leads were connected to each other by connective wires forming using wire bonding techniques. However, wire bonding has been a costly and complicated process, and the resultant wire bonds have been a source of reliability issues and have added undesired thickness to package bodies because of the need to cover them.

Accordingly, it is desirable to have a structure and method that provides an improved electrical interconnection between electronic chips and the substrates used to support them. It is also desirable to have a structure a method that is cost effective, easy to integrate into assembly process flows, and reliable.

For simplicity and clarity of the illustration, elements in the figures are not necessarily drawn to scale, and the same reference numbers in different figures can denote the same elements. Additionally, descriptions and details of well-known steps and elements may be omitted for simplicity of the description.

DETAILED DESCRIPTION OF THE DRAWINGS

The aspects of the present invention and methods for achieving the aspects will be apparent by referring to the embodiments to be described herein with reference to the accompanying drawings. It is understood that the embodiments described herein are illustrative only and that the present invention is not limited thereto, but can be implemented in alternative forms. Also, it is understood that the features of the various embodiments described herein can be combined with each other, unless specifically noted otherwise.

In accordance with the present embodiments, an electronic device can include an electronic die having a plurality of conductive connection pads on one surface. In one embodiment, the electronic die can be a semiconductor die and the conductive connection pads can be bond pads. At least one lead includes first and second regions with the first region attached to or proximate to the surface of the semiconductor die having the bond pads formed thereon. The second region extends from the first region and can extend in a direction away from the semiconductor die. A conductive layer overlaps or covers the bonds pads and at least a portion of the lead and is configured to electrically connect at least one bond pad to the lead. A package body can encapsulate the semiconductor and at least portions of die while other portions of the lead can be exposed in the package body for connecting to a next level of assembly. In one embodiment, the conductive layer can be plated layer. In another embodiment, the conductive layer can be a solder material. The present embodiments are configured to provide a simplified, cost effective, and more reliable conductive connective structure and method that overcome problems associated with previous connective structures.

Figure 1:
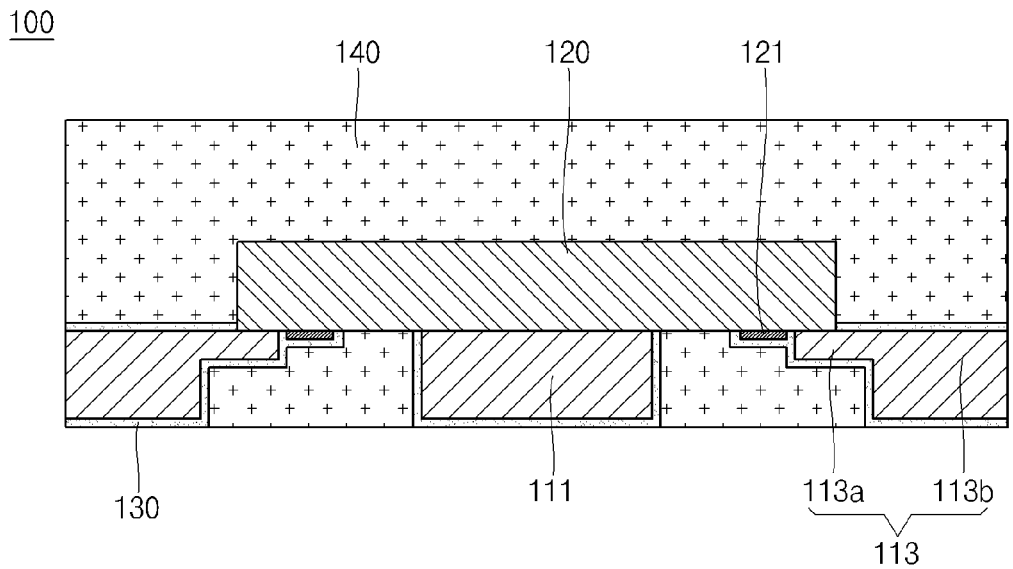
FIG. 1 illustrates a cross-sectional view of an electronic device in accordance with an embodiment of the present invention.

FIG. 1 illustrates a cross-sectional view of an electronic device in accordance with a first embodiment. In the present embodiment, the electronic device is configured as a semiconductor device 100. In one embodiment, semiconductor device 100 includes a semiconductor die 120, which can have a plurality of conductive connection pads, connection pads, or bond pads 121, and leads 113 including a first region 113a contacting or proximate to semiconductor die 120 and a second region 113b extending from first region 113a in a direction generally away from semiconductor die 120. In accordance with the present embodiment, semiconductor die 120 further includes a conductive layer 130 electrically connecting bond pads 121 to leads 113 and an encapsulant 140 encapsulating semiconductor die 120 and at least portion leads 113 to provide a package body.

In one embodiment, semiconductor device 100 can further include an optional mounting board 111, which is configured for mounting semiconductor die 120 thereto. In one embodiment, an adhesive layer (not shown) can be used to attach semiconductor die 120 to mounting board 111. In one embodiment, mounting board 111 is smaller is size than semiconductor die 120.

As generally illustrated in FIG. 1, leads 113 are spaced apart from mounting board 111 and in one embodiment can be configured to surround mounting board 111. In one embodiment, at least one of leads 113 has a lower surface (for example, the surface spaced apart from semiconductor die 120), which is positioned generally on the same horizontal plane as the lower surface of mounting board 111. In the present embodiment, first region 113a of leads 113 is configured to contact or attach to semiconductor die 120, and second region 113b of leads 113 is configured to extend from first region 113a in a direction away from semiconductor die 120. In one embodiment, first region 113a has a thinner profile or has a cross-section that is smaller than that of second region 113b, but aspects of the present embodiment are not limited thereto. Leads 113 are configured to provide a path for transmitting electrical signals between one or more external devices to semiconductor device 100. Leads 113 can be made of one or more conductive materials, such as alloys of copper (Cu), nickel (Ni) or iron (Fe), and other materials as known by those of ordinary skill in the art.

In accordance with the present embodiment, semiconductor die 120 is mounted or attached to mounting board 111 and first regions 113a of leads 113 using, for example, an adhesive material. Semiconductor die 120 is generally made of silicon, IIV-V materials, or IV-IV materials, and typically is formed to include multiple electronic devices in an integrated circuit configuration or is formed to be a discrete device. In one embodiment, bond pads 121 are formed on one major surface of semiconductor die 120, and can be configured to be input/output structures for transmitting electrical signals to and from semiconductor die 120. Although not shown, an insulating layer can be formed on the one major surface of semiconductor die 120 to insulate or passivate certain regions of semiconductor die 120, but can be patterned to expose bond pads 121 so that contact can be made thereto. In one embodiment, bond pads 121 and first regions 113a of leads 113 are spaced apart from each other. In an alternative embodiment, bond pads 121 and first regions 113a of leads 113 can make contact at least in part with each other.

In accordance with the present embodiment, conductive layer 130 is formed on semiconductor device 100 to overlap, cover, surround, adjoin, or encapsulate exposed or outer surfaces of leads 113 and bond pads 121 and is configured to electrically connect them together. In one embodiment, conductive layer 130 is a conductive connective layer or a plating layer and can be formed using a copper (Cu) plating process or other conductive plating process. In one embodiment, conductive layer 130 can be further formed over or formed to conform to the outer or exposed surfaces of second regions 113b of leads 113. In one embodiment, conductive layer 130 can be formed to surround the outer or exposed surfaces of mounting board 111.

In accordance with the present embodiment, semiconductor device 100 includes conductive layer 130 that covers at least portions of the outer surfaces of leads 113 and bond pads 121 thereby facilitating a conductive connective structure between leads 113 and semiconductor die 120. One benefit of conductive layer 130 is that it reduces the need for additional structural elements, such as wire bonds, and can be formed using, for example, available process techniques, such as plating processes so that fabrication costs can be reduced and reliability can be increased.

In one embodiment, encapsulant 140 is configured as a package body that encapsulates semiconductor die 120. In one embodiment encapsulant 140 also encapsulates at least portions of leads 113, mounting board 111, and conductive layer 130. In one embodiment, encapsulant 140 is formed so that outer lateral surfaces of second regions 113b of leads 113 are exposed. In one embodiment, encapsulant 140 is formed so that lower or bottom surfaces of mounting board 111 and leads 113, which can be positioned on the same general horizontal plane, are exposed. In one embodiment, encapsulant 140 is configured to cover the top and lateral surfaces of semiconductor die 120. Encapsulant 140 is configured to protect semiconductor device 100 from external environments, such as heat, moisture or shock, by sealing the semiconductor die 120. Encapsulant 140 can be a silicon resin, an epoxy resin, or other materials as known by those of ordinary skill in the art.

As described above, semiconductor device 100 according to the present embodiment utilizes conductive layer 130 to electrically connect leads 113 to semiconductor die 120. Conductive layer 130 is disposed to surround or cover leads 113 and bond pads 121 on semiconductor die 120 thereby electrically connecting leads 113 to semiconductor die 120. In accordance with the present embodiment, conductive layer 130 provides a simplified and cost effective connective structure between leads 113 and semiconductor die 120. In addition, because conductive layer 130 is fixedly formed on the outer surfaces of leads 130 and bond pads 121, semiconductor die 120 can be more easily sealed by encapsulant 140.

Figure 2:
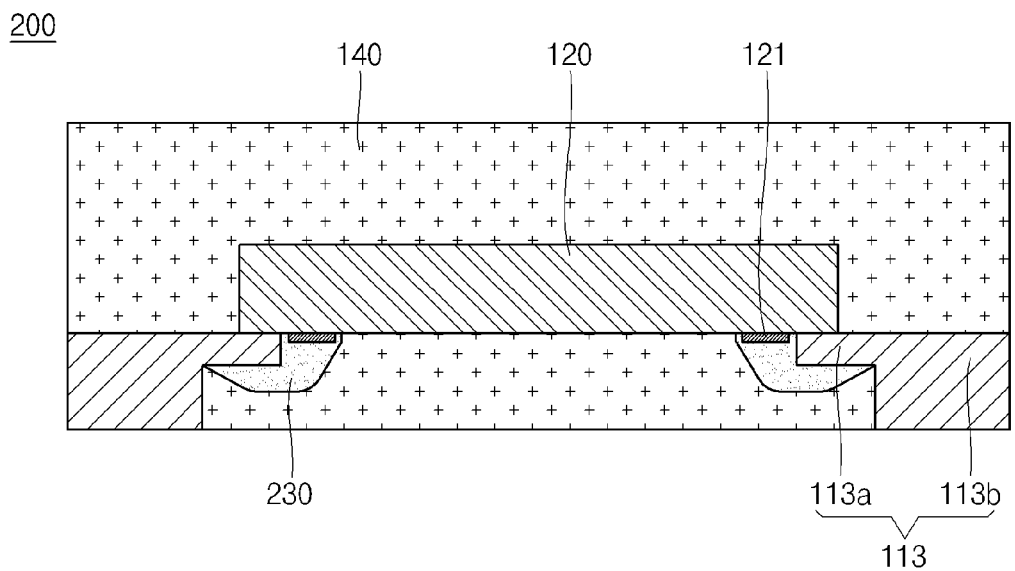
FIG. 2 illustrates a cross-sectional view of an electronic device in accordance with another embodiment of the present invention.

FIG. 2 illustrates a cross-sectional view of an electronic device in accordance with another embodiment. In the present embodiment, the electronic device is configured as a semiconductor device 200. Semiconductor device 200 includes semiconductor die 120 including bond pads 121, leads 113 including first regions 113a contacting semiconductor die 120 and second regions 113b extending from the first region 113a in a direction generally away from semiconductor die 120. Conductive layers 230 are configured to electrically connect bond pads 121 to leads 113. An encapsulant 140 encapsulates the semiconductor die 120 and at least portions of leads 113 to provide a package body. In the present embodiment, a mounting board is not illustrated, but it is understood that a mounting board, such as mounting board 111, can be included.

In one embodiment, conductive layer 230 is configured as a conductive connective layer and can be formed using a solder material. In one embodiment, conductive layer 230 can be formed to cover, encapsulate, overlap, or adjoin bond pads 121 and portions of leads 113, such as all of or only portions of first regions 113a. Conductive layer 230 is configured to electrically connect semiconductor die 120 and leads 113 together. Conductive layer 230 can be made of solder materials, such as alloys of tin (Sn), lead (Pb) or silver (Ag), or other materials as known by those of ordinary skill in the art. Conductive layer 230 can be a solder paste or pre-form solder material.

In accordance with the present embodiment, semiconductor device 200 utilizes conductive layers 230 of solder material to electrically connect leads 113 to semiconductor die 120. In one embodiment, the solder material can be disposed to cover, encapsulate, adjoin, or overlap first regions 113a of leads 113 thereby electrically connecting leads 113 to semiconductor die 120. Conductive layer 230 facilitates a cost effective conductive connective structure that does not require additional assembly elements, such as wire bonds. Further, because conductive layer 230 can be a single layer of solder material fixedly formed on outer surfaces of first regions 113a and bond pads 121, semiconductor die 120 can be more easily sealed by encapsulant 140.

Figure 3:
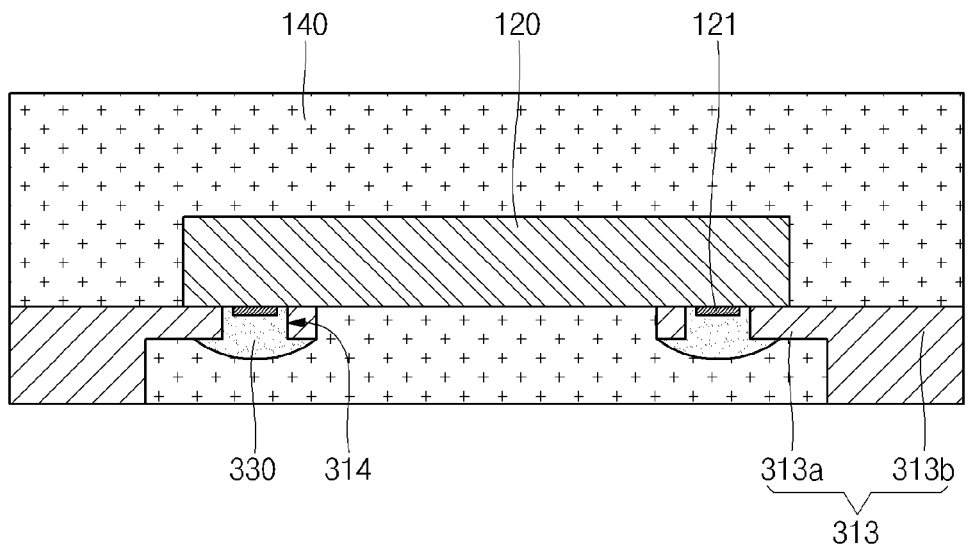
FIG. 3 illustrates a cross-sectional view of an electronic device in accordance with a further embodiment of the present invention.

FIG. 3 illustrates a cross-sectional view of an electronic device in accordance with a further embodiment. In the present embodiment, the electronic device is configured as a semiconductor device 300. Semiconductor device 300 is similar to semiconductor devices 100 and 200 and the following description will describe the differences between the present embodiment and the previous embodiments.

Semiconductor device 300 includes semiconductor die 120 including plurality of bond pads 121, leads 313 including a first region 313a contacting semiconductor die 120 and a second region 313b extending from first region 313a in a direction away from semiconductor die 120. A conductive layer 330 is provided to electrically connect bond pads 121 to leads 313. An encapsulant 140 encapsulates semiconductor die 120 and at least portions of leads 313 to provide a package body. In the present embodiment, a mounting board is not illustrated, but it is understood that a mounting board, such as mounting board 111, can be included.

In the present embodiment, first regions 313a of leads 113 contact or are proximate to semiconductor die 120 and second regions 313b of leads 113 extend from first regions 313a in a direction away from semiconductor die 120. In one embodiment, first regions 313a have a thinner profile or cross section that is smaller than that of second region 313b, but aspects of the present embodiment are not limited thereto. In addition, holes or windows 314 can be formed in leads 313 (for example, in first regions 313a) at locations corresponding to locations of bond pads 121 on semiconductor die 120. In the present embodiment, holes 314 within first regions 313a are configured to expose bond pads 121. Leads 313 are configured to provide a path for transmitting electrical signals between one ore more external devices and semiconductor device 300. Leads 313 can be made of one or more conductive materials, such as alloys of copper (Cu), nickel (Ni) or iron (Fe), and other materials as known by those of ordinary skill in the art.

In one embodiment, conductive layer 330 is configured as a conductive connective layer and can be formed using a solder material. In accordance with the present embodiment, conductive layer 330 is formed on semiconductor device 300 to overlap, cover, surround, adjoin, or encapsulate exposed or outer surfaces of bond pads 121 and at least portions of leads 113, such as all of or only portions of first regions 313a and is configured to electrically connect these elements together. In one embodiment, conductive layer 330 is formed to cover holes 314 within first regions 313a of leads 313. In one embodiment, solder material is disposed or formed to cover bond pads 121, which are positioned within holes 314. In one embodiment, conductive layer 330 of solder material covers or overlaps bond pads 121 and at least portions of first region 313a thereby electrically connecting leads 313 to semiconductor die 120. Conductive layer 330 can be made of solder materials, such as alloys of tin (Sn), lead (Pb) or silver (Ag), or other materials as known by those of ordinary skill in the art. Conductive layer 330 can be a solder paste or pre-form solder material.

Semiconductor device 300 in accordance with the present embodiment includes holes 314 placed, for example, in first regions 313a of leads 313 at locations corresponding to bond pads 121 on semiconductor die 120. Conductive layer 330 of solder material is formed or disposed within holes 314 and disposed adjoining at least portions of leads 313 thereby electrically connecting leads 313 to the semiconductor die 120. Conductive layer 330 facilities a cost effective conductive connective structure that does not require additional assembly elements, such as wire bonds. In addition, because bond pads 121 are positioned within holes 314, which are filled with solder material, the conductive connective structure between leads 313 and bond pads 121 can be performed more accurately. More particularly, the foregoing hole configuration of the present embodiment can improve reliability. Further, because conductive layer 330 can be a single layer of solder material fixedly formed on outer surfaces of first regions 313a and bond pads 121, semiconductor die 120 can be more easily sealed by encapsulant 140.

Figure 4:
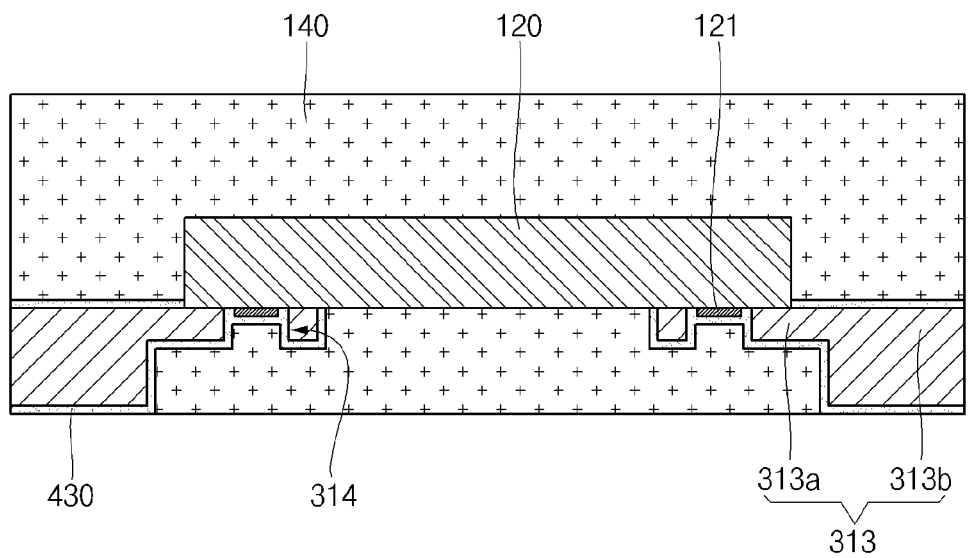
FIG. 4 illustrates a cross-sectional view of an electronic device in accordance with a still further embodiment of the present invention.

FIG. 4 illustrates a cross-sectional view of an electronic device in accordance with a still further embodiment. In the present embodiment, the electronic device is configured as a semiconductor device 400. Semiconductor device 400 is similar to semiconductor devices 100, 200 and 300 and the following description will describe the differences between the present embodiment and the previous embodiments.

Semiconductor device 400 in accordance with the present embodiment includes semiconductor die 120 including plurality of bond pads 121, leads 313 including first regions 313a contacting semiconductor die 120 and second regions 313b extending from first regions 313a in a direction away from semiconductor die 120, a conductive layer 430 configured to electrically connect bond pads 121 to leads 313, and an encapsulant 140 encapsulating semiconductor die 120 and at least portions of leads 313. Similarly to semiconductor device 300, holes or windows 314 can be formed in leads 313 (for example, in first regions 313a) at locations corresponding to locations of bond pads 121 on semiconductor die 120. In the present embodiment, a mounting board is not illustrated, but it is understood that a mounting board, such as mounting board 111, can be included.

In accordance with the present embodiment, conductive layer 430 is formed on semiconductor device 400 to overlap, cover, surround, adjoin, or encapsulate exposed outer surfaces of bond pads 121 and at least portions of leads 113 and is configured to electrically connect them together. In one embodiment, conductive layer 430 is a conductive connective layer or a plating layer and can be formed using a copper (Cu) plating process or other conductive plating process. In one embodiment, conductive layer 430 can be formed to surround outer surfaces of leads 313 and holes 314 in which bond pads 121 are positioned to electrically connect leads 313 and semiconductor die 120 together. In one embodiment, conductive layer 430 can be further formed over or to conform to the outer or exposed surfaces of second regions 313b of leads 313.

In accordance with the present embodiment, semiconductor device 400 includes the holes 314 placed, for example, in first regions 313a of leads 313 at locations corresponding to bond pads 121 on semiconductor die 120. Conductive layer 430 of plated conductive material is formed or disposed within holes 314 in which bond pads 121 are positioned and further formed to cover or surround (at least in part) leads 313 thereby electrically connecting leads 313 to semiconductor die 120. Conductive layer 430 facilities a cost effective conductive connective structure that does not require additional assembly elements, such as wire bonds. In addition, because bond pads 121 are positioned within holes 314, which are covered with conductive plated material, the conductive connective structure between leads 313 and bond pads 121 can be performed more accurately. More particularly, the foregoing hole configuration of the present embodiment can improve reliability. Further, because conductive layer 430 can be a plated layer that fixedly formed along outer surfaces of leads 330 and bond pads 121, semiconductor die 120 can be easily sealed by encapsulant 140.

Figure 5:
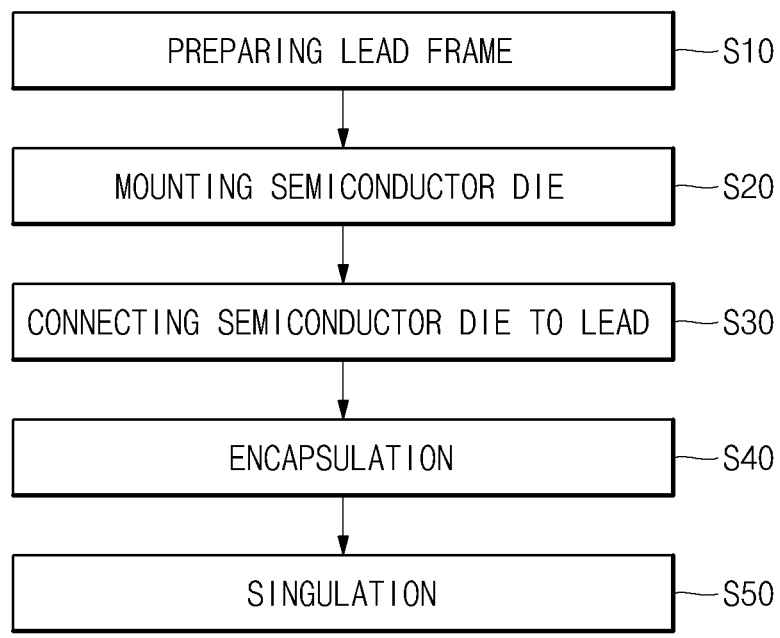
FIG. 5 illustrates a flowchart of a fabricating method of an electronic device in accordance with an embodiment of the present invention.

FIG. 5 illustrates a flowchart for fabricating an electronic device in accordance with a first embodiment. In the present embodiment, the electronic device is described as a semiconductor device. As illustrated in FIG. 5, the fabrication method includes providing or preparing a lead frame or substrate (S10), mounting a semiconductor die in spaced relationship with the lead frame (S20), connecting the semiconductor die to a lead of lead frame (30), encapsulating the structure (S40) and singulating the structure (S50) to provide packaged electronic or semiconductor devices.

Figure 6A:
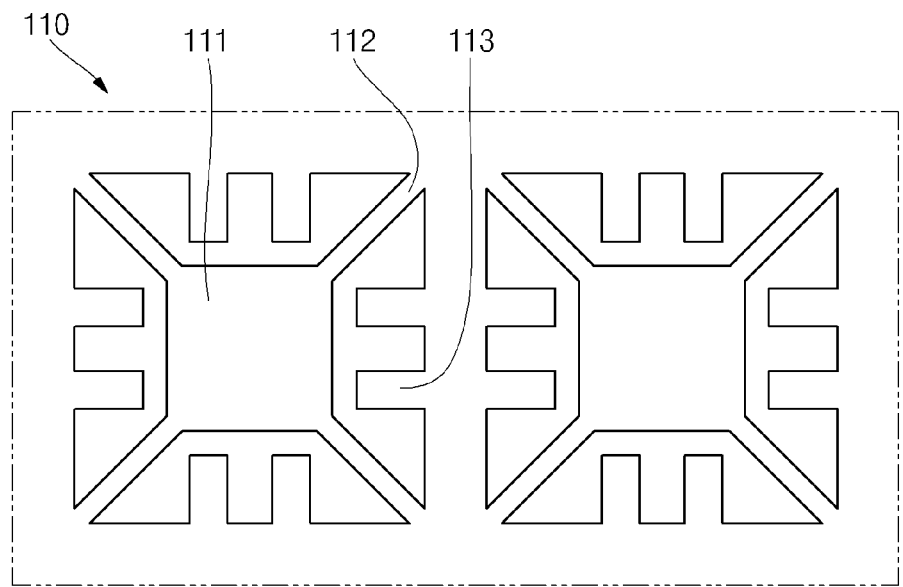
FIGS. 6A to 6G illustrate bottom views and cross-sectional views of an electronic device at various stages of fabrication in accordance with an embodiment of the present invention.
Figure 6B:
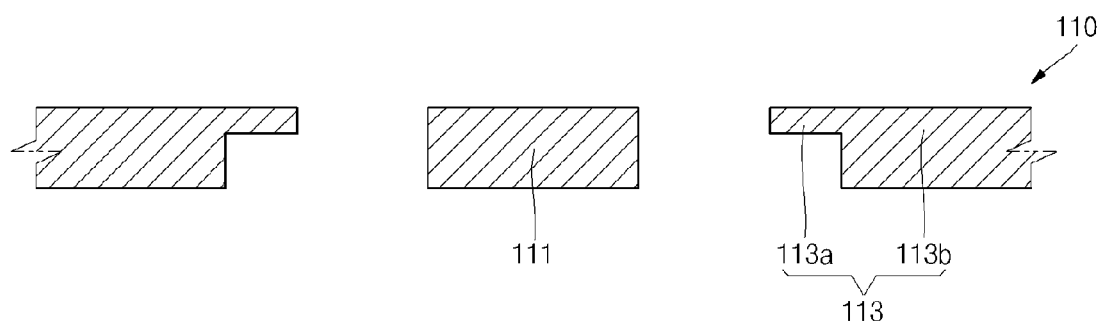

FIGS. 6A to 6G illustrate cross-sectional views and bottom views of an electronic device (for example, semiconductor device 100) at various stages of fabrication in accordance with a first embodiment. By way of example, a method for fabricating semiconductor device 100 will be described with reference to FIG. 5 and FIGS. 6A to 6G. As illustrated in FIGS. 5, 6A and 6B, in step S10, a lead frame 110 is provided that includes a plurality of leads 113. In one embodiment, lead frame 110 can further include a mounting board or support structure 111 positioned generally on the same plane as leads 113. In other embodiments, mounting board 111 is not included. In one embodiment, leads 113 are provided in lead frame 110 and generally surround mounting board 111. In one embodiment, mounting board 111 can be fixed within lead frame 110 using tie bars 112.

In one embodiment, leads 113 are spaced apart from mounting board 111 and surround mounting board 111. In one embodiment, lower surfaces (for example, surfaces that will be exposed within the package body) of leads 113 are positioned generally on the same plane as the lower surface (for example, the surface that will be exposed within the package body) of mounting board 111. In one embodiment, leads 113 are configured to include first regions 113a and second regions 113b extending from first regions 113a in a direction away from mounting board 111 (or semiconductor die 120 if mounting board 111 is not used). In one embodiment and as generally illustrated in FIG. 6B, first regions 113a can have a thinner profile or a cross-section that is smaller than that of second regions 113b in thickness, but aspects of the present embodiment are not limited thereto. Lead frame 110 can be made of one or more conductive materials, such as alloys of copper (Cu), nickel (Ni) or iron (Fe), or other materials as known to those of ordinary skill in the art.

Figure 6C:
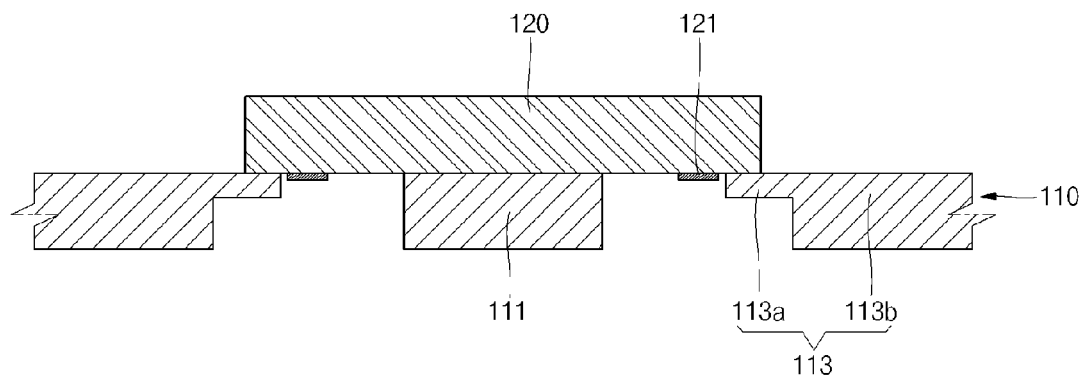
Figure 6D:
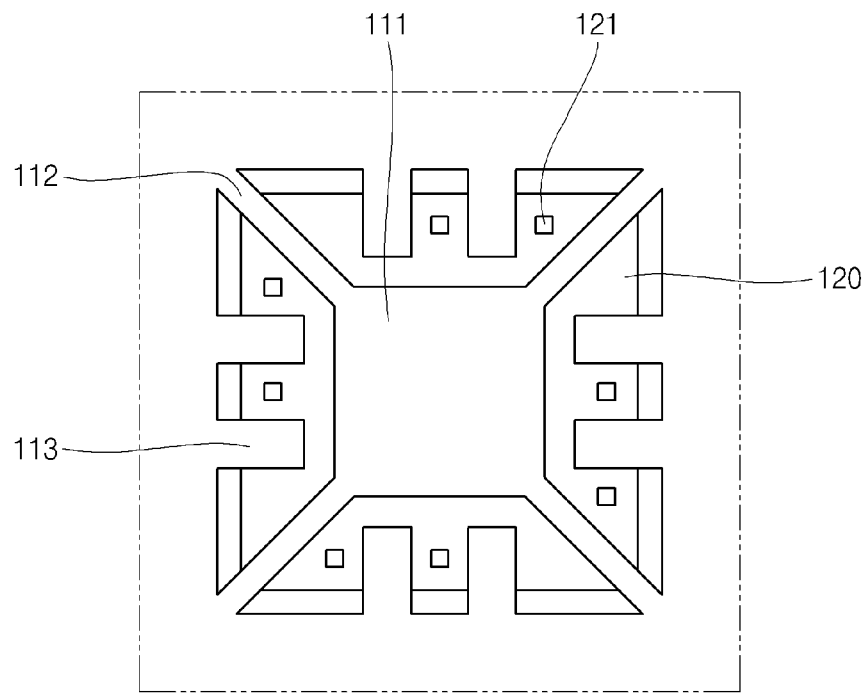

As illustrated in FIGS. 5, 6C and 6D, in step S20, semiconductor die 120, which includes bond pads 121, can be mounted on or attached directly or indirectly to lead frame 110. In one embodiment, semiconductor die 120 is connected to the lead frame 110 such that the surface thereof having bond pads 121 formed thereon faces mounting board 111 and first regions 113a of leads 113. In one embodiment, semiconductor die 120 can be attached to mounting board 111 by an adhesive layer. In one embodiment, first regions 113a are brought into contact with edge regions of semiconductor die 120 on the same surface as bond pads 121. In one embodiment, semiconductor die 120 is larger than the mounting board 111 in size, but aspects of the present embodiment are not limited thereto. In one embodiment, bond pads 121 and first regions 113a of leads 113 are spaced apart from each other. In alternative embodiment, bond pads 121 and first regions 113a of leads 113 can overlap and make contact at least in part with each other.

Figure 6E:
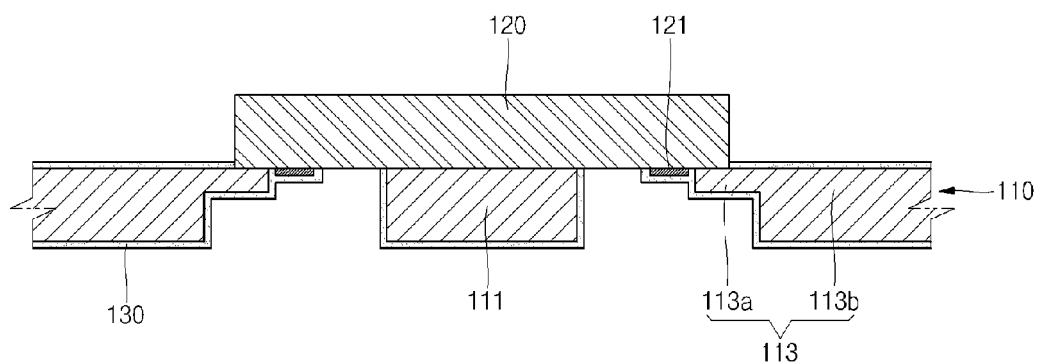

As illustrated in FIGS. 5 and 6E, in step S30, semiconductor die 120 and leads 113 are connected to each other using conductive layer 130. In one embodiment, conductive layer 130 is formed by electroplating or plating lead frame 110 having semiconductor die 120 mounted thereon using a conductive plating solution, such as a copper (Cu) plating solution. In one embodiment, a copper sulfate solution can be used. In one embodiment, conductive layer 130 is formed to surround, overlap, conform to, adjoin, or cover outer or exposed surfaces of leads 113 and bond pads 121 thereby electrically connecting them together. In one embodiment, because side portions of second regions 113a of leads 113 are connected to another lead by lead frame 110, conductive layer 130 is formed on leads 113 except for the side portions thereof. In one embodiment, conductive layer 130 can be formed on outer or exposed surfaces of mounting board 111.

Figure 6F:
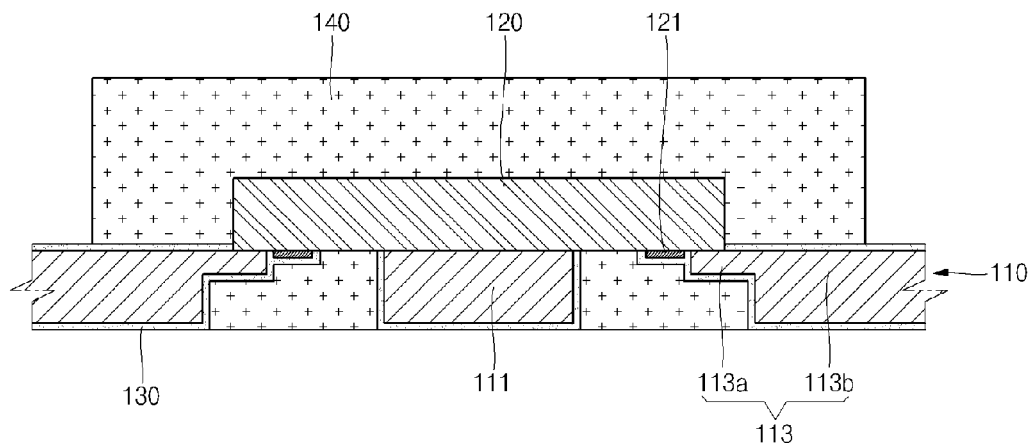

As illustrated in FIGS. 5 and 6F, in step S40, mounting board 111, leads 113 and semiconductor die 120 can be encapsulated using encapsulant 140 to form a package body. In one embodiment, side and bottom surfaces of lead 113 and bottom surface of mounting board 111 are exposed through or within encapsulant 140 (that is, not covered by encapsulant 140). In one embodiment, encapsulant 140 can be formed to encapsulate the structure from proximate to the bottom surface of second regions 113b towards the direction of the top surface of semiconductor die 120. In one embodiment, encapsulant 140 entirely covers the top and lateral surfaces of semiconductor die 120. In an alternative embodiment, the back surface (that is, the surface opposite to bond pads 121) can be exposed within encapsulant 140.

Figure 6G:
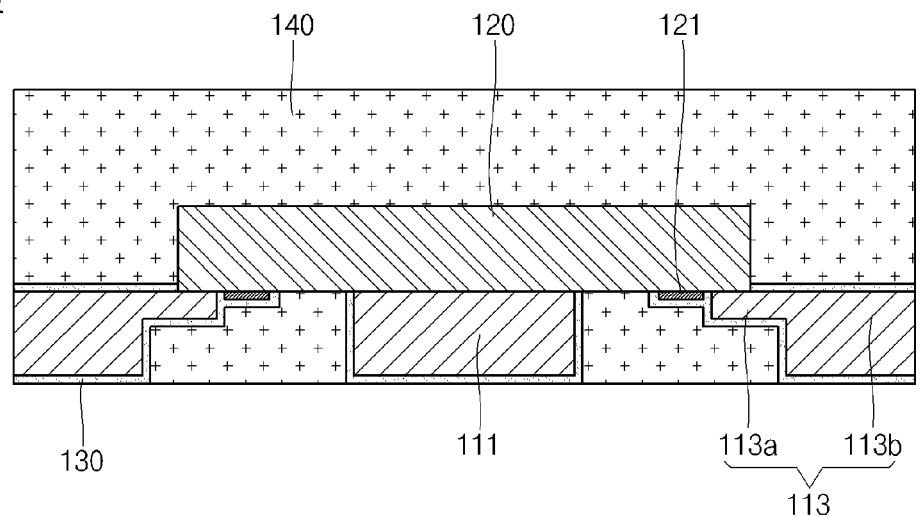

As illustrated in FIGS. 5 and 6G, in step S50, singulation is performed to form an individual semiconductor device 100 by cutting the side portions of leads 113 or lead frame 110 exposed by encapsulant 140. In one embodiment, the side portions of leads 113 or lead frame 110 exposed by encapsulant 140 can be singulated, thereby completing a single semiconductor device 100 from lead frame 110.

In the method of fabricating semiconductor device 100 according to the present embodiment, conductive layer 130 is formed to electrically connect leads 113 to semiconductor die 120. In one embodiment, conductive layer 130 is formed as a plating layer on certain outer surfaces of semiconductor device 100 to surround, overlap, or cover portions of leads 113 and bond pads 121 of semiconductor die 120, thereby electrically connecting leads 113 to bond pads 121. This provides, a conductive connection structure between leads 113 and bond pads 121 that can be achieved using existing plating processes or other processes. Also, because additional assembly elements, such as wire bonds, are not required to connect leads 113 to bond pads 121, fabricating costs can be reduced, reliability can be increased, and the thickness of the electronic package can be reduced. Further, because conductive layer 130 is formed directly on the outer surfaces of leads 113 and bond pads 121, semiconductor die 120 can be more easily sealed using encapsulant 140.

Figure 7A:
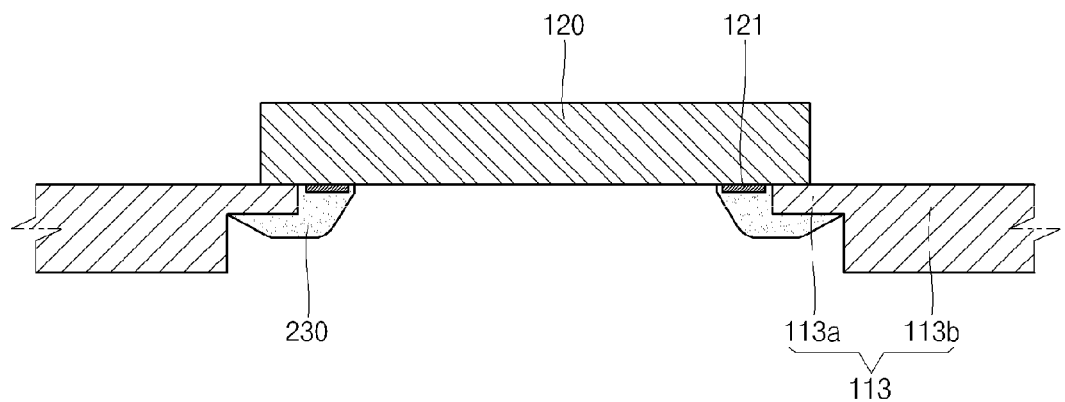
FIGS. 7A to 7C illustrate cross-sectional views of an electronic device and various stages of fabrication in accordance with another embodiment of the present invention.
Figure 7B:
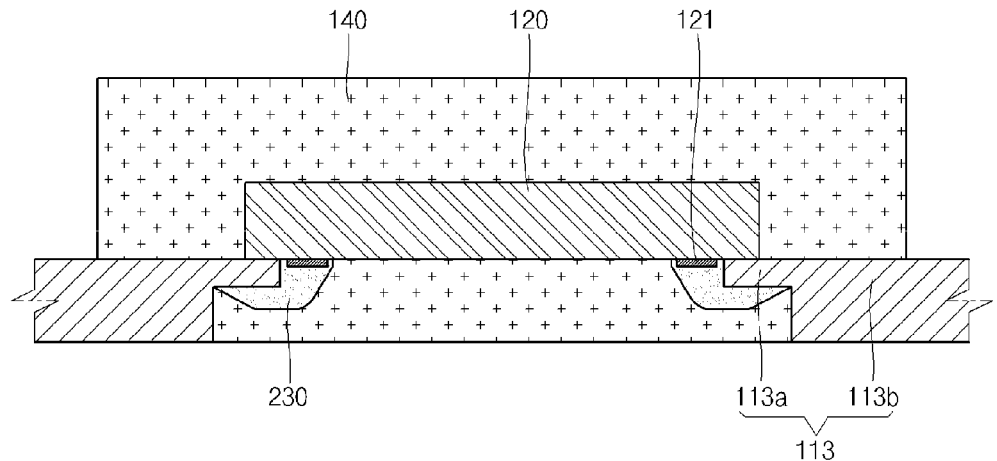
Figure 7C:
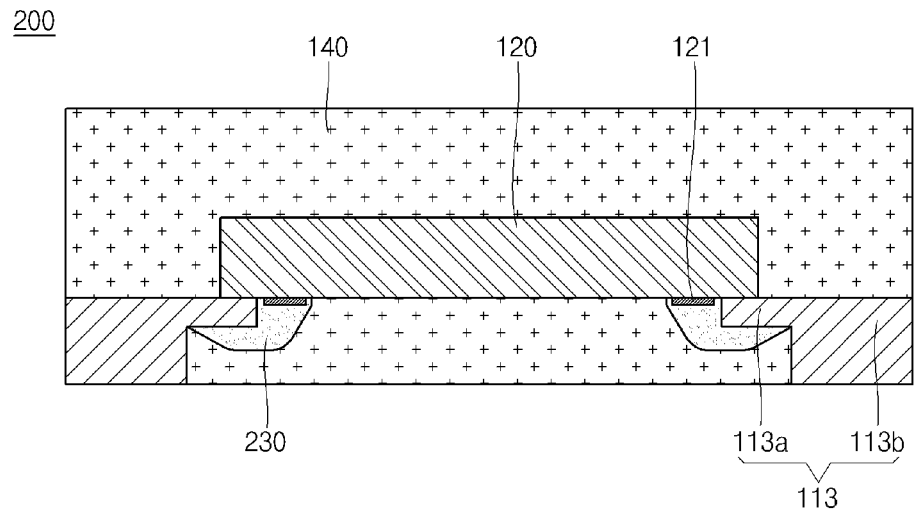

FIGS. 7A to 7C illustrate cross-sectional views of an electronic device (for example, semiconductor device 200) at various stages of fabrication in accordance with another embodiment. By way of example, a method for fabricating semiconductor device 200 will be described with reference to FIGS. 7A to 7C together with FIG. 5. As illustrated in FIG. 5, the fabrication of semiconductor device 200 can be performed in substantially the same manner as in the previous embodiment up to step S20. In the present embodiment, the lead frame is illustrated without a mounting board and a tie bar. It is understood that, similar to the previous embodiment, the lead frame can include a mounting board and one or more tie bars.

As illustrated in FIGS. 5 and 7A, in step S30, semiconductor die 120 and leads 113 are electrically connected to each other using conductive layer 230, which in the present embodiment can be a solder material. In one embodiment, conductive layer 230 can formed by coating a solder paste on first regions 113a of leads 113 and bond pads 121 and subjecting the resulting structure to a reflow process at a temperature ranging from about 150 degrees Celsius to about 200 degrees Celsius. In one embodiment, the solder paste is applied with the leadframe having semiconductor die 120 facing upward in order to better control the application of the solder paste. In one embodiment, conductive layer 230 covers or overlaps first regions 113a and bond pads 121, thereby electrically connecting leads 113 to semiconductor die 120.

As illustrated in FIGS. 5 and 7B, in step S40, semiconductor die 120 and at least portions of leads 113 are encapsulated using encapsulant 140 to form a package body. In one embodiment, encapsulant 140 is configured so as to expose side portions of leads 113. In one embodiment, encapsulant 140 can be formed to expose side and bottom portions of the lead 113. In one embodiment, encapsulant 140 is formed to encapsulate from proximate to the bottom surface of second regions 113b towards the direction of the top surface of semiconductor die 120 while exposing the side and bottom portions of second regions 113b. In one embodiment, encapsulant 140 entirely covers the top and lateral surfaces of semiconductor die 120. In an alternative embodiment, the back surface of semiconductor die 120 (that is, the surface opposite to bond pads 121) can be exposed within encapsulant 140.

As illustrated in FIGS. 5 and 7C, in step S50, singulation of an individual semiconductor device 200 is performed by cutting the side portions of leads 113 exposed by encapsulant 140. In one embodiment, the side portions of leads 113 or lead frame 110 exposed by encapsulant 140 can be singulated, thereby completing a single semiconductor device 200 from lead frame 110.

In the method of fabricating semiconductor device 200 according to the present embodiment, conductive layer 230 including a solder layer is formed to electrically connect leads 113 to semiconductor die 120. In one embodiment, conductive layer 230 is formed as a solder layer on certain outer surfaces of semiconductor device 200 to surround, overlap, or cover portions of leads 113 and bond pads 121 of semiconductor die 120, thereby electrically connecting leads 113 to bond pads 121. This provides, a conductive connection structure between leads 113 and bond pads 121 that can be achieved using existing or other solder processes. Also, because additional assembly elements, such as wire bonds, are not required to connect leads 113 to bond pads 121, fabricating costs can be reduced and reliability can be increased. Further, because conductive layer 230 is formed directly on the outer surfaces of leads 113 and bond pads 121, semiconductor die 120 can be more easily sealed using encapsulant 140.

FIG. 8A to 8E illustrate cross-sectional views and bottom views of an electronic device (for example, semiconductor device 300) at various stages of fabrication in accordance with a further embodiment. By way of example, a method for fabricating semiconductor device 300 will be described with reference to FIGS. 8A to 8E together with FIG. 5. As illustrated in FIG. 5, the fabrication of semiconductor device 300 can be performed in substantially the same manner as in the previous embodiment up to step S10. In the present embodiment, the lead frame is illustrated without a mounting board and a tie bar. It is understood that, similar to the first embodiment, the lead frame can include a mounting board and one or more tie bars. In semiconductor device 300 leads 313 are configured to include first regions 313a, second regions 313b, and holes 314 formed in, for example, first regions 313a.

Figure 8A:
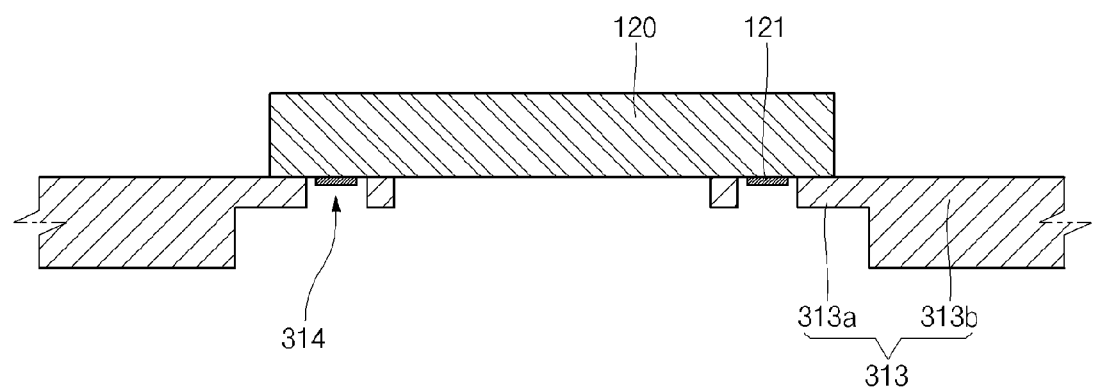
FIGS. 8A to 8E illustrate cross-sectional views and bottom views of an electronic device at various stages of fabrication in accordance with a further embodiment of the present invention.
Figure 8B:
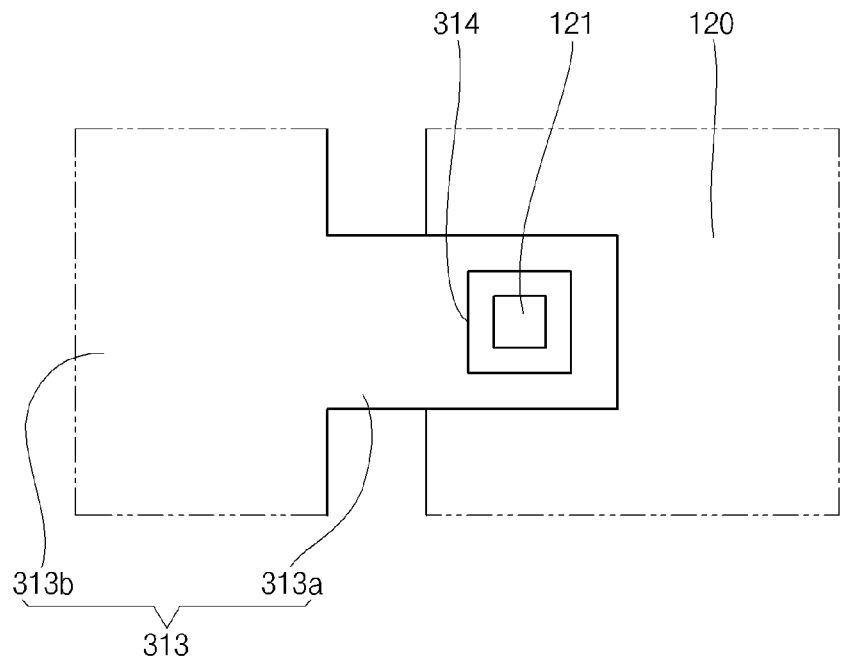

As illustrated in FIGS. 5, 8A and 8B, in step S20, semiconductor die 120, which includes a plurality of bond pads 121, can be mounted on leads 313. In one embodiment, second regions 313b extend from first regions 313a in a direction away from semiconductor die 120. In one embodiment and as generally illustrated in FIG. 8A, first regions 313a can have a thinner profile or a cross-section that is smaller than that of second regions 113b in thickness, but aspects of the present embodiment are not limited thereto. In accordance with the present embodiment, holes 314 can be formed in leads 313 at locations corresponding to the location of bond pads 121 on semiconductor die 120. In one embodiment, holes 314 are in first regions 313a.

In one embodiment, semiconductor die 120 is connected to leads 313 such that the surface of semiconductor die 120 that includes bond pads 121 is adjacent to and faces leads 313. In one embodiment, one surface of semiconductor die 120 is brought into contact with first regions 313a of leads 313 with bond pads 121 exposed, framed, or surrounded by holes 314 within first regions 313a. In one embodiment, semiconductor die 120 is connected to leads 313 such that bond pads 121 are positioned within holes 314 as generally illustrated in FIG. 8B. In one embodiment, bond pads 121 and first regions 313a are spaced apart from each other. In another embodiment, bond pads 121 and first regions 313a can overlap and can be in contact (at least in part) with each other by reducing, for example, the width of holes 314.

Figure 8C:
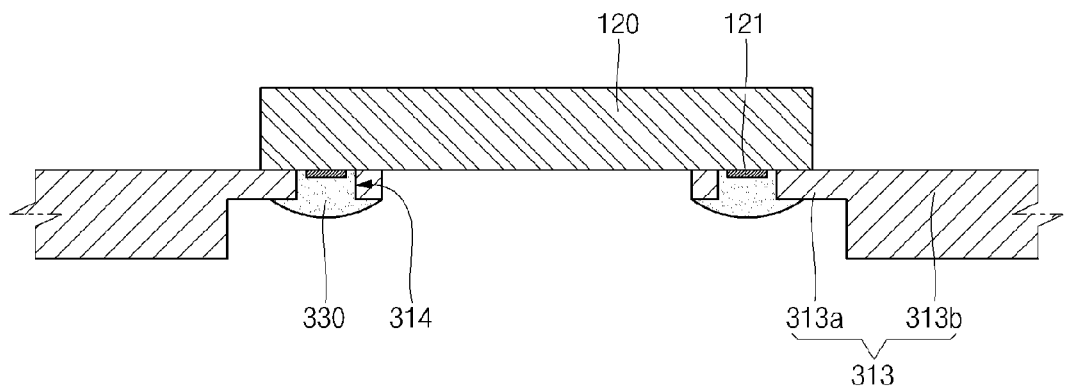

As illustrated in FIGS. 5 and 8C, in step S30, bond pads 121 and leads 113 are connected to each other using a conductive layer 330, which in the present embodiment can be a solder material. In one embodiment, conductive layer 330 can be formed by coating a solder paste on first regions 313a of leads 313 within holes 314 and subjecting the resulting structure to a reflow process at a temperature ranging from about 150 degrees Celsius to about 200 degrees Celsius. In one embodiment, the solder paste is applied with the leadframe having semiconductor die 120 facing upward in order to better control the application of the solder paste. In one embodiment, solder 330 covers or overlaps first regions 313a and bond pads 121, thereby electrically connecting leads 313 to semiconductor die 120.

Figure 8D:
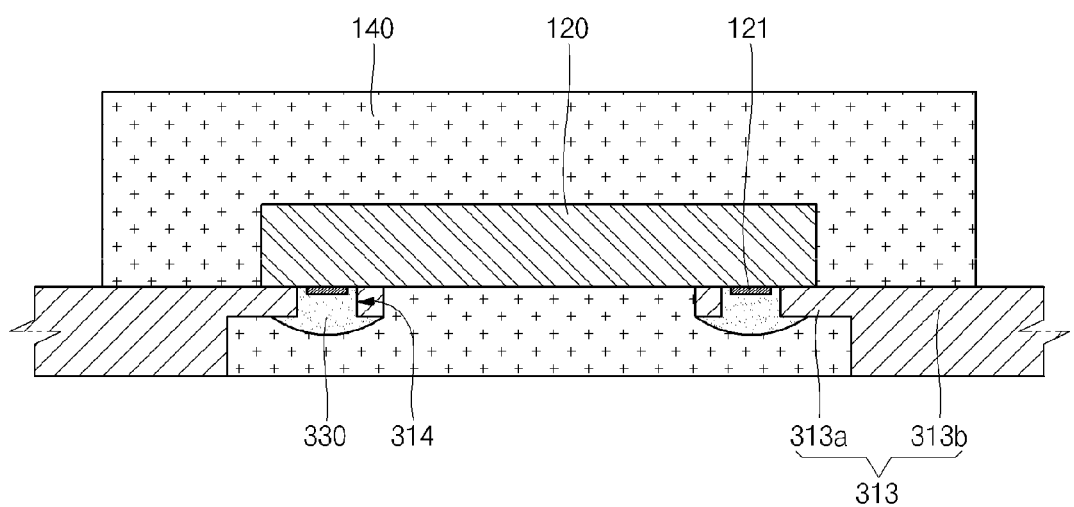

As illustrated in FIGS. 5 and 8D, in step S40, semiconductor die 120 and at least portions of leads 313 are encapsulated using the encapsulant 140 to provide a package body. In one embodiment, encapsulant 140 is configured so as to expose side portions of leads 313. In one embodiment, encapsulant 140 can be formed to expose side and bottom portions of the lead 313. In one embodiment, encapsulant 140 is formed to encapsulate from proximate to the bottom surface of second regions 313b towards the direction of the top surface of semiconductor die 120 while exposing the side and bottom portions of second regions 313b. In one embodiment, encapsulant 140 entirely covers the top and lateral surfaces of semiconductor die 120. In an alternative embodiment, the back surface of semiconductor die 120 (that is, the surface opposite to bond pads 121) can be exposed within encapsulant 140.

Figure 8E:
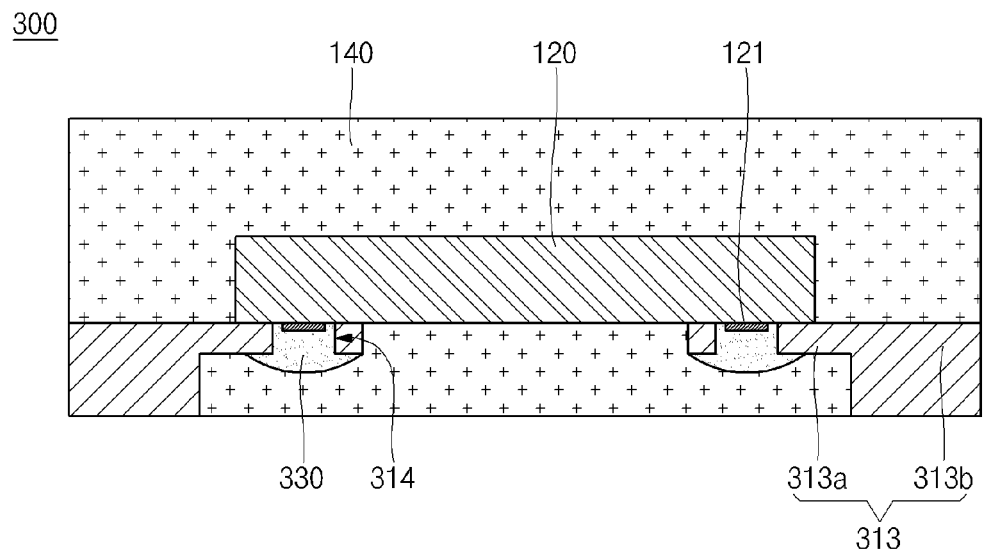

As illustrated in FIGS. 5 and 8E, in step S50, singulation of an individual semiconductor device 300 is performed by cutting the side portions of leads 313 exposed by encapsulant 140. In one embodiment, the side portions of leads 313 or lead frame 110 exposed by encapsulant 140 can be singulated, thereby completing a single semiconductor device 300 from the lead frame.

In the method of fabricating semiconductor device 300 according to the present embodiment, conductive layer 330 is formed to electrically connect leads 313 to semiconductor die 120. In one embodiment, conductive layer 330 is formed as a solder layer on certain outer surfaces of semiconductor device 300 to surround, overlap, or cover portions of leads 313 and bond pads 121 of semiconductor die 120, thereby electrically connecting leads 313 to semiconductor die 120. This provides, a conductive connection structure between leads 313 and bond pads 121 that can be achieved using existing or other solder processes. Also, because additional assembly elements, such as wire bonds, are not required to connect leads 313 to bond pads 121, fabricating costs can be reduced and reliability can be increased. In addition, bond pads 121 can be positioned within holes 314 and holes 314 can be filled with conductive layer 330, thereby more accurately achieving the conductive connective structure between leads 313 and bond pads 121, which can also improve reliability. Further, because conductive layer 330 is formed to cover holes 314 within first regions 313a, semiconductor die 120 can be more easily sealed by encapsulant 140.

Figure 9A:
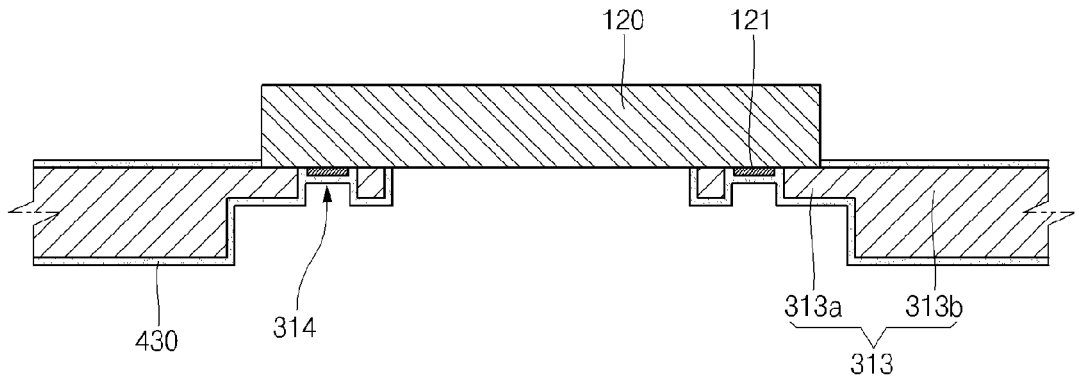
FIGS. 9A to 9C illustrate cross-sectional views of an electronic device at various stages of fabrication in accordance with a still further embodiment of the present invention.
Figure 9B:
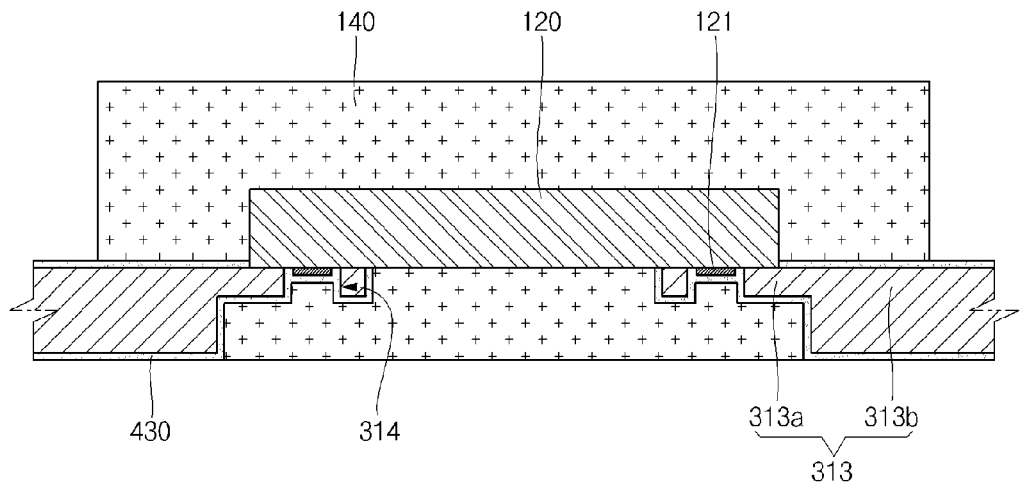
Figure 9C:
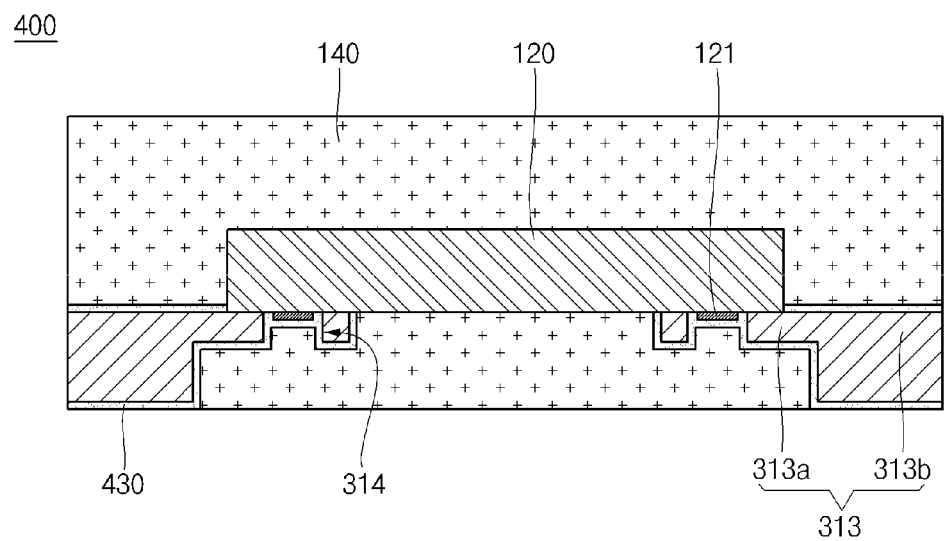

FIGS. 9A to 9C illustrate cross-sectional views of an electronic device (for example, semiconductor device 400) at various stages of fabrication in accordance with a still further embodiment. By way of example, a method for fabricating semiconductor device 400 will be described with reference to FIGS. 9A to 9C together with FIG. 5. As illustrated in FIG. 5, semiconductor device 400 can be fabricated in a similar manner as semiconductor device 300 up to step S20. In the present embodiment, lead frame 110 is illustrated without a mounting board and a tie bar. It is understood that, similar to the first embodiment, lead frame 110 can include a mounting board and one or more tie bars.

As illustrated in FIGS. 5 and 9A, in step S30, bond pads 121 and leads 313 can be connected to each other using conductive layer 430, which in the present embodiment can be a plated conductive layer. In one embodiment, conductive layer 430 can be formed by electroplating or plating lead frame 110 having semiconductor die 120 mounted thereon using a conductive plating solution, such as a copper (Cu) plating solution. In one embodiment, a copper sulfate solution can be used. In one embodiment, conductive layer 430 is formed to surround, overlap, conform to, adjoin, or cover outer or exposed surfaces of leads 113 and bond pads 121 thereby electrically connecting them together. In one embodiment, conductive layer 430 is formed to surround or fill holes 314 in leads 313 in which bond pads 121 are positioned. In one embodiment, because side portions of leads 313 are connected to another lead by lead frame 110, conductive layer 430 is formed on leads 313 except for the side portions thereof. In accordance with the present embodiment, bond pads 121 and leads 313 are electrically connected to each other by conductive layer 430.

As illustrated in FIGS. 5 and 9B, in step S40, leads 313 and semiconductor die 120 are encapsulated using encapsulant 140 to form a package body. In one embodiment, side and bottom surfaces of lead 313 are exposed through or within encapsulant 140. In one embodiment, encapsulant 140 can be formed to encapsulate the structure from proximate to the bottom surface of second regions 313b towards the direction of the top surface of semiconductor die 120. In one embodiment, encapsulant 140 entirely covers the top and lateral surfaces of semiconductor die 120. In an alternative embodiment, the back surface (that is, the surface opposite to bond pads 121) can be exposed within encapsulant 140.

As illustrated in FIGS. 5 and 9C, in step S50, singulation is performed to form an individual semiconductor device 400 by cutting the side portions of leads 313 exposed by encapsulant 140. In one embodiment, the side portions of leads 313 or lead frame 110 exposed by encapsulant 140 can be singulated, thereby completing a single semiconductor device 400 from the lead frame.

In the method of fabricating semiconductor device 400 according to the present embodiment, conductive layer 430 is formed to electrically connect leads 313 to semiconductor die 120. In one embodiment, conductive layer 430 is formed as a plated layer on certain outer surfaces of semiconductor device 400 to surround, overlap, or cover portions of leads 313 and bond pads 121 of semiconductor die 120, thereby electrically connecting leads 313 to bond pads 121. This provides, a conductive connection structure between leads 313 and bond pads 121 that can be achieved using existing or other plating processes. Also, because additional assembly elements, such as wire bonds, are not required to connect leads 313 to bond pads 121, fabricating costs can be reduced and reliability can be increased. In addition, because bond pads 121 are positioned within holes 314 and conductive layer 430 is formed to surround holes 314, outer surfaces of bond pads 121, and leads 313, the conductive connective structure between leads 313 and bond pads 121 can be performed more accurately, which can also improve reliability. Further, because conductive layer 430 is fixedly formed on the outer surfaces of leads 313 and bond pads 121, semiconductor die 120 can be easily sealed by encapsulant 140.

From all of the foregoing, one skilled in the art can determine that, according to an embodiment, an electronic device (for example, elements 100, 200, 300, 400) comprises an electronic die (for example, element 120) including a conductive pad (for example, element 121) on a major surface. A lead (for example, elements 113, 313) includes a first region (for example, elements 113a, 313a) in spaced relationship with the electronic die and a second region (for example, elements 113b, 313b) extending from the first region in a direction away from the electronic die. A conductive layer (for example, elements 130, 230, 330, 430) overlaps the conductive pad and the lead thereby electrically connecting the conductive pad to the lead. A package body (for example, element 140) covering the electronic die and at least portions of lead.

In one embodiment of the foregoing device, a mounting board (for example, element 111) can be positioned on the same plane as the lead and can be spaced apart from the lead. In another embodiment, the mounting board can be surrounded by a plurality of leads. In a further embodiment the conductive pad can contact the lead. In a still further embodiment, the conductive layer is a plating layer (for example, elements 130, 430) that surrounds conductive pad and at least portions of the lead. In yet a further embodiment, an outer lateral surface of the lead is absent plated material. In another embodiment, the conductive layer can be a solder layer (for example, elements 230, 330) covering the conductive pad and a hole (for example, element 314) in the first region. In a further embodiment, the conductive layer can be a solder material covering the conductive pad and the hole. In a still further embodiment, the conductive layer can be a plated material covering the conductive pad and at least portions of the lead. In yet a further embodiment, the package body can entirely encapsulate the electronic die.

From all of the foregoing, one skilled in the art can determine that, according to an additional embodiment, an electronic package device (for example, elements 100, 200, 300, 400) comprises an electronic die (for example, element 120) having a plurality of conductive pads (for example, element 121) on a major surface. A plurality of leads (for example, elements 113, 313), each lead being in spaced relationship with the major surface. A conductive layer (for example, elements 130, 230, 330, 430) covers each conductive pad and at least a portion of each lead. A package body (for example, element 140) encapsulates at least portions of the electronic die and at least portions of the plurality of leads.

From all of the foregoing, one skilled in the art can determine that, according to a further embodiment, a method for forming an electronic device (for example, elements 100, 200, 300, 400) includes providing a lead frame (for example, element 110) including a plurality of leads (for example, elements 113, 313), the plurality of leads each having a first region (for example, elements 113a, 313a) and a second region (for example, elements 113b, 313b) extending from the first region. The method includes attaching an electronic die (for example, element 120) including a plurality of conductive pads (for example, element 121) on a major surface to the lead frame. The method includes forming a conductive layer (for example, elements 130, 230, 330, 430) to connect the conductive pads to the leads and encapsulating the electronic die and at least portions of the leads and with an encapsulant (for example, element 140).

In one embodiment of the foregoing method, the method can further include mounting the electronic die to a mounting board (for example, element 111). In another embodiment, the method can include attaching the conductive pads to the leads. In a further embodiment, forming the conductive layer can include plating the conductive layer in a copper plating solution. In a still further embodiment, forming the conductive layer can include plating the conductive layer to surround the conductive pads and at least portions of the leads. In yet a further embodiment, forming the conductive layer can include forming a solder layer covering the conductive pads and at least portions of the leads. In another embodiment, attaching the electronic die can include placing the conductive pads within windows (for example, element 314) and covering the windows with a solder layer or a plated layer. In a further embodiment, encapsulating the electronic die includes forming a package body that encapsulates from a bottom surface of the second region towards a direction of a top surface of the electronic die and entirely covering the electronic die.

In view of all the above, it is evident that a novel structure and method are disclosed. Included, among other features, is an electronic die having bond pads on at least one surface. The one surface is attached to or proximate to a plurality of leads. A conductive layer overlaps or covers the bond pads and at least portions of the leads thereby electrically connective the leads to the electronic die. The conductive layer provides a simplified, cost effective, and more reliable conductive connective structure. Additionally, the conductive layer provides a conductive connective structure with a lower profile compared to previous connective structures.

While the subject matter of the invention is described with specific preferred embodiments and example embodiments, the foregoing drawings and descriptions thereof depict only typical embodiments of the subject matter and are not, therefore, to be considered limiting of its scope. It is evident that many alternatives and variations will be apparent to those skilled in the art. For example, the conductive layer can be formed by other processes, such as sputtering, chemical vapor deposition, or evaporation processes.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and form different embodiments, as would be understood by those skilled in the art.

What is claimed is:

1. An electronic device comprising:
    an electronic die including a conductive pad on a major surface, the conductive pad having a first bonding surface spaced apart from the major surface of the electronic die and a sidewall bonding surface extending from the first bonding surface towards the major surface;
    a lead including a first region adjacent the electronic die and a second region extending from the first region in a direction away from the electronic die, wherein the first region of the lead has a lead sidewall surface adjacent to and laterally spaced apart from the sidewall bonding surface of the conductive pad and, wherein the first region of the lead is laterally spaced apart from at least a portion of the first bonding surface of the conductive pad;
    a conductive layer affixed to the first bonding surface of the conductive pad and affixed to the lead sidewall surface thereby electrically connecting the conductive pad to the lead, and wherein the conductive layer is affixed to the sidewall bonding surface of the conductive pad; and
    a package body covering the electronic die and at least portions of the lead.

2. The device of claim 1, further comprising a mounting board attached to the electronic die.

3. The device of claim 1, wherein the electronic die contacts a lead major surface proximate to the lead sidewall surface, and wherein the first region is laterally spaced apart from the conductive pad.

4. The device of claim 3, wherein the conductive layer is absent between the major surface of the electronic die and the lead major surface.

5. The device of claim 1, wherein the first region is thinner than the second region.

6. The device of claim 1, wherein the conductive layer comprises a plated material affixed to at least a portion of the first region.

7. The device of claim 1, wherein the conductive layer comprises a solder material affixed to at least a portion of the first region.

8. The device of claim 1, wherein:
    the first region includes a hole having the lead sidewall surface;
    the sidewall bonding surface of the conductive pad is within the hole and laterally spaced apart from the lead sidewall surface;
    the first region physically contacts the major surface of the electronic die; and
    the conductive layer overlaps the hole.

9. The device of claim 1, wherein:
    the major surface of the electronic die faces the lead, the electronic device further comprises a second lead spaced apart from the lead to provide a gap between the lead and the second lead, and the conductive pad is disposed in the gap.

10. An electronic package device comprising:

an electronic die having a conductive pad on a major surface, the electronic die having a die side surface, wherein the conductive pad has a first bonding surface spaced apart from the major surface of the electronic die and a sidewall bonding surface extending from the first bonding surface towards the major surface;

a lead adjacent the major surface, wherein the lead has a lead sidewall surface proximate to but laterally spaced apart from the conductive pad so that the lead sidewall surface is disposed between the sidewall bonding surface of the conductive pad and the die side surface;

a conductive layer affixed to the first bonding surface of the conductive pad and disposed along the sidewall bonding surface of the conductive pad and affixed to at least a portion of the lead sidewall surface to electrically connect the conductive pad to the lead; and a package body encapsulating at least portions of the electronic die and at least a portion of the lead.

11. The device of claim 10, wherein the lead comprises a first region and a second region extending from the first region in a direction away from the electronic die;

the first region includes the lead sidewall surface;

the first region is thinner than the second region; and the first region is proximate to the conductive pad.

12. The device of claim 11, wherein the first region includes a hole extending through the first region, and wherein the hole has the lead sidewall surface, and wherein the sidewall bonding surface is disposed within the hole.

13. The device of claim 10, wherein the conductive layer comprises a solder material.

14. The device of claim 10, wherein the conductive layer comprises a plated material.

15. A method for forming an electronic device comprising:

providing an electronic die including a conductive pad on a major surface, the conductive pad having a first bonding surface spaced apart from the major surface of the electronic die and a sidewall bonding surface extending from the first bonding surface towards the major surface;

providing a lead frame including a lead, wherein the lead comprises a first region having a lead sidewall surface and second region extending from the first region;

coupling the electronic die to the leadframe, wherein the electronic die contacts a lead major surface proximate to the lead sidewall surface, and wherein the first region is laterally spaced apart from the conductive pad;

forming a conductive layer affixed to the first bonding surface of the conductive pad, affixed to the sidewall bonding surface of the conductive pad, and affixed to the lead sidewall surface thereby electrically connecting the conductive pad to the lead; and encapsulating the electronic die and at least a portion of the lead with an encapsulant.

16. The method of claim 15, wherein encapsulating includes leaving a side portion of the lead exposed; the method further comprising singulating through the exposed side portion of the lead.

17. The method of claim 15, wherein:

providing the lead frame includes providing the lead frame where the first region is thinner than the second region;

coupling the electronic die includes attaching the major surface to the lead, wherein the conductive pad is laterally spaced apart from the lead to provide a gap between the lead and the conductive pad; and forming the conductive layer includes covering the sidewall bonding surface of the conductive pad.

18. The method of claim 17, wherein forming the conductive layer includes plating the conductive layer.

19. The method of claim 17, wherein forming the conductive layer includes forming a solder layer.

20. The method of claim 17, wherein:

providing the lead frame includes providing the lead frame where the first region includes a hole;

attaching the electronic die includes attaching the electronic die so that the conductive pad is within the hole; and forming the conductive layer comprises covering the hole with the conductive layer.

* * * * *